US012366831B2

(12) United States Patent
Zihlmann et al.

(10) Patent No.: US 12,366,831 B2
(45) Date of Patent: Jul. 22, 2025

(54) FABRICATION OF GLASS CELLS FOR HERMETIC GAS ENCLOSURES

(71) Applicant: mb-microtec ag, Niederwangen (CH)

(72) Inventors: Serge Lukas Zihlmann, Gasel (CH); Johannes Peter Kind, Bern (CH)

(73) Assignee: mb-microtec ag, Niederwangen (CH)

( * ) Notice: Subject to any disclaimer, the term of this patent is extended or adjusted under 35 U.S.C. 154(b) by 427 days.

(21) Appl. No.: 17/749,653

(22) Filed: May 20, 2022

(65) Prior Publication Data

US 2023/0375983 A1  Nov. 23, 2023

(51) Int. Cl.
*C03B 15/14* (2006.01)
*C03B 23/057* (2006.01)
*G04F 5/12* (2006.01)
*G04F 5/14* (2006.01)
*B81B 3/00* (2006.01)
*B81C 1/00* (2006.01)

(52) U.S. Cl.
CPC ............. *G04F 5/12* (2013.01); *C03B 15/14* (2013.01); *C03B 23/057* (2013.01); *G04F 5/14* (2013.01); *B81B 3/0078* (2013.01); *B81B 2201/058* (2013.01); *B81C 1/00682* (2013.01); *B81C 2203/0145* (2013.01); *B81C 2203/0172* (2013.01)

(58) Field of Classification Search
CPC ..... C03B 15/14; C03B 23/057; C03B 23/047; C03B 23/18
See application file for complete search history.

(56) References Cited

U.S. PATENT DOCUMENTS 3,215,517 A   11/1965   Zimmermann
3,706,543 A   12/1972   Thuler
(Continued)

FOREIGN PATENT DOCUMENTS

AT    513 294 A1    3/2014
CN    105271653 A   1/2016
(Continued)

OTHER PUBLICATIONS

Kim et al, "Chip-Scale Terahertz Carbonyl Sulfide (OCS) Clock: An Overview and Recent Studies on Long-Term Frequency Stability of OCS Transitions," IEEE Transactions on Terahertz Science and Technology, May 2019, 15 pages.
(Continued)

*Primary Examiner* — Erin Snelting
(74) *Attorney, Agent, or Firm* — Sterne, Kessler, Goldstein & Fox P.L.L.C.

(57) ABSTRACT

A method of fabricating one or more glass cells includes drawing one or more glass capillaries from a source of glass material. The method includes performing a first conditioning of one or more inner surfaces of the one or more capillaries. The method includes sealing one or more first ends of the one or more capillaries using thermal energy. The method includes performing a second conditioning of the one or more inner surfaces after the sealing. The method includes purifying the one or more capillaries to increase a purity of a gas used to fill the one or more capillaries. The method includes filling the one or more capillaries using the gas after the purifying. The method includes pressurizing the one or more capillaries to a given pressure. The method includes sealing one or more second ends of the one or more capillaries using thermal energy.

6 Claims, 7 Drawing Sheets

(56) References Cited

U.S. PATENT DOCUMENTS

| | | | |
|---|---|---|---|
| 4,146,380 | A | 3/1979 | Caffarella et al. |
| 4,273,398 | A | 6/1981 | Summers et al. |
| 9,572,273 | B2 | 2/2017 | Blunier et al. |
| 10,374,621 | B2 | 8/2019 | Herbsommer et al. |
| 10,544,039 | B2 | 1/2020 | Cook et al. |
| 11,782,392 | B2 | 10/2023 | Herbsommer et al. |
| 2001/0007197 | A1 | 7/2001 | Oga et al. |
| 2004/0239038 | A1 | 12/2004 | Kramp et al. |
| 2005/0007118 | A1 | 1/2005 | Kitching et al. |
| 2007/0034809 | A1 | 2/2007 | Lal et al. |
| 2021/0139363 | A1 | 5/2021 | Enderwitz et al. |
| 2022/0107609 | A1 | 4/2022 | Herbsommer et al. |

FOREIGN PATENT DOCUMENTS

| | | |
|---|---|---|
| CN | 108911489 A | 11/2018 |
| CN | 208980572 U | 6/2019 |
| CZ | 2020-578 A3 | 5/2022 |
| DE | 10 2019 130 477 A1 | 5/2021 |
| JP | 2002-274863 A | 9/2002 |
| JP | 2004-031021 A | 1/2004 |
| JP | 2018-163910 A | 10/2018 |
| KR | 10-2006-0038538 A | 5/2006 |
| WO | WO 03/016231 A2 | 2/2003 |
| WO | WO 2014/045282 A1 | 3/2014 |
| WO | WO 2017/103133 A1 | 6/2017 |

OTHER PUBLICATIONS

Wang et al., "Chip-Scale Molecular Clock," IEEE Journal of Solid-State Circuits, Dec. 2018, 13 pages.

Wang et al., "An on-chip fully electronic molecular clock based on sub-terahertz rotational spectroscopy," Nature Electronics, Jul. 2018, 7 pages.

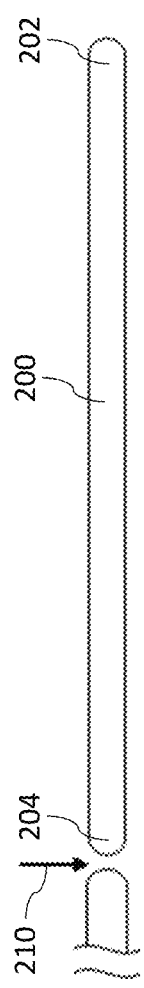

FABRICATION OF GLASS CELLS FOR HERMETIC GAS ENCLOSURES

BACKGROUND

Field

The present disclosure relates to the manufacture and use of hermetic containers, for example, hermetic glass vials.

Background

Glass containers are used for long-term hermetic containment of fluids in many applications, for example, a glass tube that holds fluid reactant in a light stick (e.g., mb-microtec's Trigalight® gaseous tritium light sources) or liquid drug stored in a glass ampule. In such applications, it is desirable for the glass container to be leak-proof for the duration of the shelf life of the product. In some cases, the limited shelf life can be a direct result of the leak rate of the container.

Certain technological spaces are looking to miniaturized, low cost hermetic fluid storage. For example, atomic and molecular oscillator clocks can use low pressure gas cells that, when irradiated, provide the quantum transitions and transition frequencies needed to maintain a stable time counter. Some common gas cells can be based on microelectromechanical system (MEMS) enclosures, which provide a moving member to close an opening once the miniature gas cell is filled with a given gas. However, a problem with MEMS-based cells is that the MEMS lid may fail to provide a perfect seal that is reliable for long periods of time (e.g., months or even decades). Furthermore, the construction of MEMS-based gas cells can be complex and expensive.

SUMMARY

Accordingly, there is a need to provide a low-cost and scalable gas enclosure that can reliably maintain gas purity and pressure for extended periods of time. Such gas enclosures (or cells) can be fabricated based on aspects described herein.

In some aspects, a method of fabricating one or more glass cells for enclosing a gas can comprise drawing one or more glass capillaries from a source of glass material is disclosed. The drawing can comprise setting a cross section of the one or more glass capillaries to a height of approximately 0.15 to 5 mm and a width of approximately 0.3 to 10 mm. The drawing can also comprise drawing the one or more glass capillaries to a length of approximately 5 to 1500 mm. The method can also comprise performing a first conditioning of one or more inner surfaces of the one or more capillaries. The first conditioning can comprise a wet, dry, or wet and dry cleaning processes. The method can also comprise sealing one or more first ends of the one or more capillaries using thermal energy. The method can also comprise performing a second conditioning of the one or more inner surfaces after the sealing. The second conditioning can comprise a wet, dry, or wet and dry cleaning processes. The second conditioning can also comprise heating the one or more capillaries to accelerate degassing of the one or more inner surfaces. The second conditioning can also comprise evacuating impurities from the one or more capillaries using a vacuum system. The method can also comprise purifying the one or more capillaries to increase a purity of a gas eventually used to fill the one or more capillaries. The purifying can comprise filling the one or more capillaries using one or more gases. The purifying can also comprise evacuating the one or more capillaries after the filling. The method can also comprise filling the one or more capillaries using the gas after the purifying. The method can also comprise pressurizing the one or more capillaries to a given pressure. The method can also comprise sealing one or more second ends of the one or more capillaries using thermal energy.

In some aspects, a time reference device can comprise one or more hermetic glass cells. The one or more hermetic glass cells can have a cross section and a length each of approximately 5 mm or greater. In some aspects, the cross section can have a height of approximately 0.15 to 5 mm and a width of approximately 0.3 to 10 mm. The one or more hermetic glass cells can enclose a dipolar gas. A pressure of the dipolar gas in the hermetic glass cell can be approximately 0.001 to 100 mbar. A purity of the dipolar gas can be approximately 90% or greater. The one or more hermetic glass cells can be structured as seamless enclosures. The time reference device is configured to provide a time reference based on a vibrational or rotational spectrum of the dipolar gas.

In some aspects, a system comprises a manifold, a valve, a pressure gauge, and a heating system. The manifold can connect two or more capillaries to a common pressure junction. The valve can be connected to the pressure junction. The valve can isolate the two or more capillaries from a portion of the system. The pressure gauge can be connected to the pressure junction. The heating system can heat the two or more capillaries to degas inner surfaces of the two or more capillaries. The system can purify the two or more capillaries to increase a purity a gas used to fill the two or more capillaries. The system can also fill the two or more capillaries using the gas. The system can also pressurize the two or more capillaries to a given pressure using a vacuum system and the pressure gauge.

Further features of various aspects of the present disclosure are described in detail below with reference to the accompanying drawings. It is noted that the present disclosure is not limited to the specific aspects described herein. Such aspects are presented herein for illustrative purposes only. Additional aspects will be apparent to those skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the present disclosure and to enable those skilled in the relevant art(s) to make and use aspects described herein.

FIGS. 2A-2F show a capillary, according to some aspects.

Figure 1:
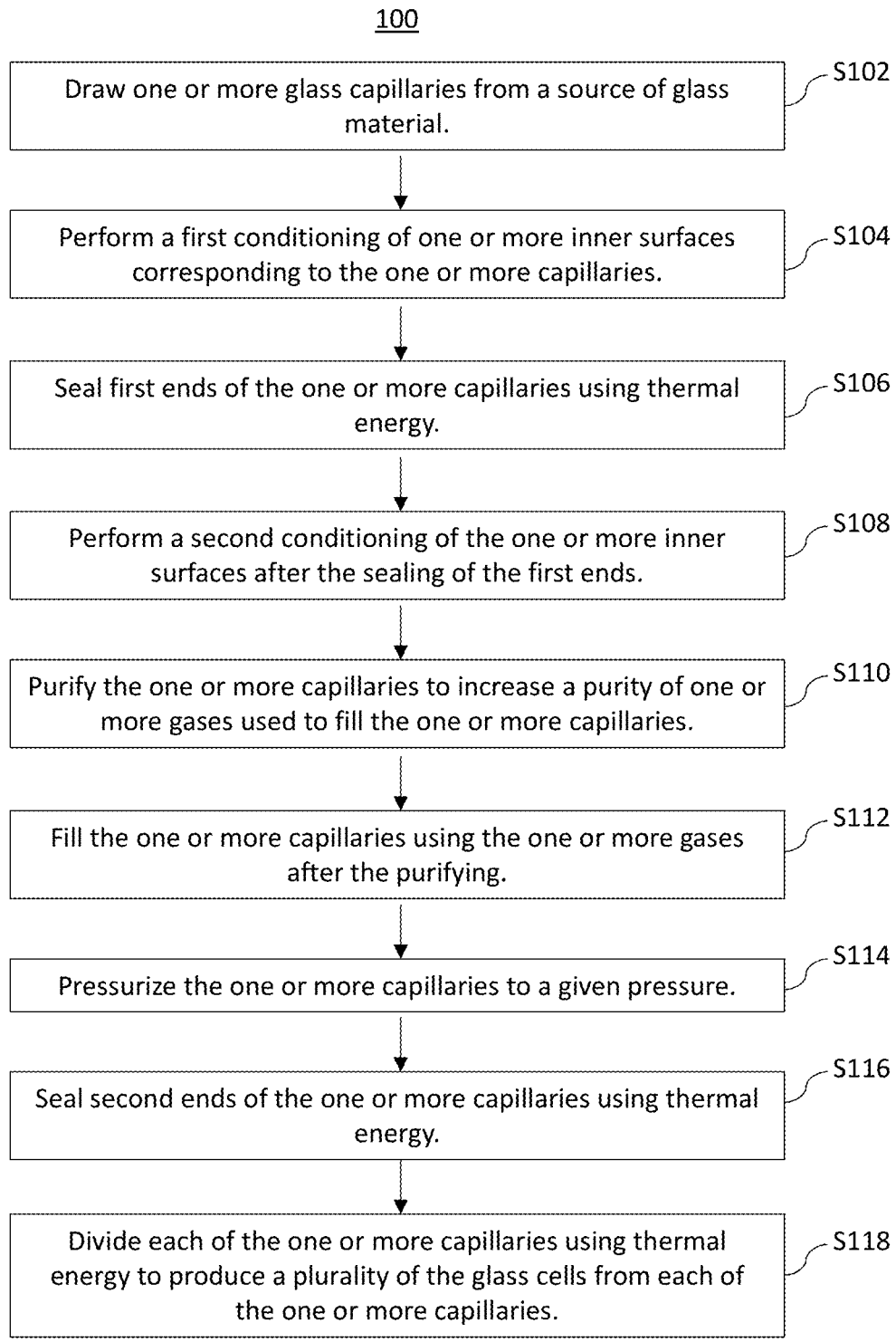
FIG. 1 shows a flowchart of method steps for fabricating one or more glass cells for enclosing a gas, according to some aspects.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

The aspects described herein, and references in the specification to "one aspect," "an aspect," "an exemplary aspect," "an example aspect," etc., indicate that the aspects described can include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is understood that it is within the knowledge of those skilled in the art to effect such feature, structure, or characteristic in connection with other aspects whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein can likewise be interpreted accordingly.

The terms "about," "approximately," or the like can be used herein to indicate the value of a given quantity that can vary based on a particular technology. Based on the particular technology, the terms "about," "approximately," or the like can indicate a value of a given quantity that varies within, for example, 10-30% of the value (e.g., ±10%, ±20%, or ±30% of the value).

Example Glass Cell Fabrication Method

FIG. 1 shows a flowchart 100 of method steps for fabricating one or more glass cells for enclosing a gas, according to some aspects. In some aspects, step S102 can comprise drawing one or more glass capillaries from a source of glass material. The drawing can comprise, for example, setting a cross section of the one or more glass capillaries to a height of approximately 0.15 to 5 mm and a width of approximately 0.3 to 10 mm. The drawing can also comprise drawing the one or more glass capillaries to a length of approximately 5 to 1500 mm. A wall thickness of the capillary can be, for example, approximately 50 microns to 1 mm.

In some aspects, the glass material can have a low working temperature (e.g., a temperature at which it is possible to shape the glass). For example, the glass material can be a silicate based glass. Some non-limiting examples of silicate based glass can include a borosilicate, aluminosilicate, soda, soda-lime, lead, quartz glass or phosphate-based glass. The glass material can have a low dielectric loss factor. Other glass compositions can be employed, without departing from the spirit and scope of this disclosure.

In some aspects, step S104 can comprise performing a first conditioning of one or more inner surfaces of the one or more capillaries. The first conditioning can comprise a wet cleaning process, a dry cleaning process, or both. The first conditioning can also comprise heating the one or more capillaries to accelerate degassing of the one or more inner surfaces. The first conditioning can also comprise evacuating impurity from the one or more capillaries using a vacuum system.

In some aspects, step S106 can comprise sealing first ends of the one or more capillaries using thermal energy. Thermal energy can be sourced by, for example, gas or plasma flame, laser radiation, or the like. Each capillary can comprise a first end and a second end.

In some aspects, enumerative adjectives (e.g., "first," "second," "third," or the like) can be used to distinguishing like elements without establishing an order, hierarchy, or numeric correspondence (unless otherwise noted). For example, the terms "first end" and "second end" can distinguish two ends without specifying a particular order or hierarchy. Furthermore, an element in a drawing is not limited to any particular enumerative adjective. For example, if a first end is labeled in a drawing, the labeled first end can alternatively be referred to as a second end, in which case another end can use an appropriately distinguishing enumerative adjective.

In some aspects, step S108 can comprise performing a second conditioning of the one or more inner surfaces. The second conditioning of the one or more inner surfaces can be performed, for example, after the sealing of first ends at step S106. During the hermetic closure of the first ends of the one or more capillaries, some contamination of inner surfaces can occur. The second conditioning can comprise a wet cleaning process, a dry cleaning process, or both. The second conditioning can also comprise heating the one or more capillaries to accelerate degassing of the one or more inner surfaces. The second conditioning can also comprise evacuating impurity from the one or more capillaries using a vacuum system.

In some aspects, step S110 can comprise purifying the one or more capillaries to increase a purity of a gas used to fill the one or more capillaries. The gas can comprise, for example, a dipolar gas. The dipolar gas can comprise, for example, carbonyl sulfide (COS or OCS), water vapor ($H_2O$), ammonia ($NH_3$), hydrogen cyanide (HCN), or the like. The dipolar gas can comprise one of those listed above, or a combination of two or more. Again, other gas compositions can be employed. The purifying can comprise filling the one or more capillaries using the gas and/or an inert gas (i.e., one or more gases). The inert gas can be one type of inert gas or a combination of inert gas types. The purifying can also comprise evacuating the one or more capillaries using the vacuum system. The evacuating of step S110 can be performed after the filling of S110. Step S110 can be iterated additional times (e.g., performed two or more times) to further increase a purity of the gas, using the same type of gas each time or different types of gases.

In some aspects, step S112 can comprise filling the one or more capillaries using the gas. Step S112 can be performed, for example, after the purifying step S110.

In some aspects, step S114 can comprise pressurizing the one or more capillaries to a given pressure. For certain applications, such as time reference devices, pressure values, below atmosphere can be desirable. Pressures can be, for example, approximately 0.001 to 100 mbar, 50 to 100 mbar, 0.01 to 10 mbar, or the like.

In some aspects, step S116 can comprise sealing second ends of the one or more capillaries using thermal energy.

In some aspects, step S118 can comprise dividing each of the one or more capillaries using thermal energy to produce a plurality of the glass cells. The glass cells can be cut to lengths of, for example, approximately 5 mm or greater, 7 mm or greater, 10 mm or greater, or the like.

Figure 2D:
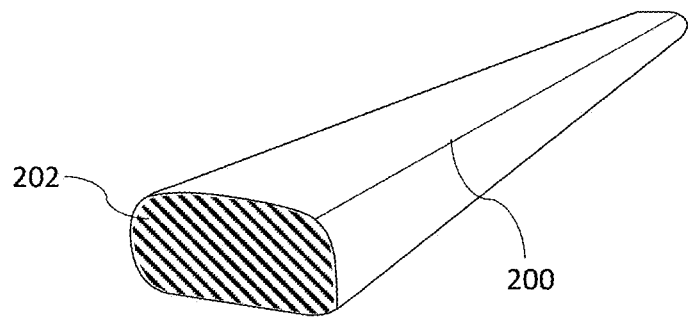

FIGS. 2A, 2B, 2C and 2D show a capillary 200, according to some aspects. FIG. 2A shows capillary 200 after the drawing step S102 (FIG. 1). FIG. 2B shows capillary 200 after the sealing step S106 (FIG. 1). In some aspects, capillary 200 can comprise a first sealed end 202 (e.g., a first end). FIG. 2C shows capillary 200 after the sealing step S116 (FIG. 1). Thermal energy 210, for example, is illustrated as applied to implement the sealing of the end(s) of capillary 200. Capillary 200 can comprise a second sealed end 204 (e.g., a second end). FIG. 2D shows a perspective view of capillary 200 with at least one end sealed (e.g., sealed end 202). Due to the thermal energy sealing technique, sealed end 202 (and/or end 204) can comprise an irregular surface with recesses and/or protrusions while also being seamless. Alternatively, ends 202 and/or 204 can be convex shaped (e.g., as shown in FIGS. 2B/C) or substantially flat. Other seamless geometries are possible.

In some aspects, as the diving step S118 is performed to produce a plurality of glass cells from capillary 200, the resulting structure of each glass cell can be hermetic and seamless. The glass cells can be hermetic for long durations due to the seamless structure. In some aspects, the term "seam" can refer to a structure where boundaries of two edges, surfaces, or structures make contact to one another (e.g., a lid in contact with a container). On the other hand, the term "seamless" can correspond to an absence of a seam. The structure of capillary 200 can be seamless (e.g., as shown in FIGS. 2B, 2C, and 2D). While the end structure depicted in FIG. 2D appears more complex, it is noted that end 202 can be seamless by using, for example, laser energy to seal end 202 such that the glass material is molten and fused together, thereby eliminating a boundary where two edges of the glass material would otherwise meet. As the glass cells are produced via division of one or more capillaries 200, it is possible to mass form seamless, hermetically sealed glass cells.

Figure 2E:
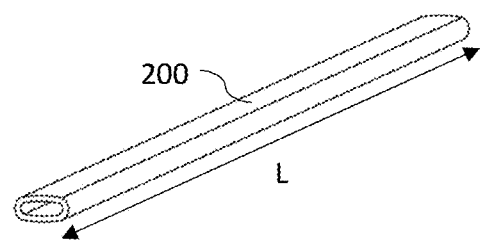
Figure 2F:
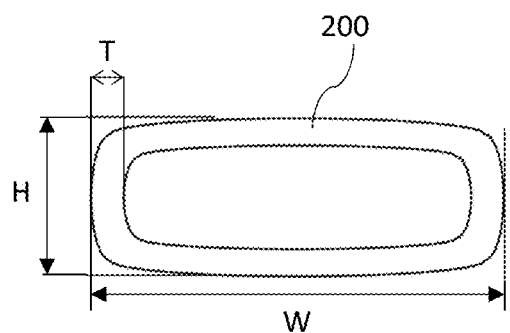

FIG. 2E shows another perspective of capillary 200, according to some aspects. In some aspects, the drawing step S102 can produce capillaries of length L. The length can be, for example, approximately 5 to 1500 mm. FIG. 2F shows a cross section of capillary 200. The drawing step S102 can produce capillaries of width W, height H, wall thickness T, and inner surface bends with average curve radius R. The width can be, for example, approximately 0.3 mm to 10 mm. The height can be, for example, approximately 0.15 to 5 mm. The wall thickness T can be, for example, approximately 50 microns to 1 mm.

Figure 3:
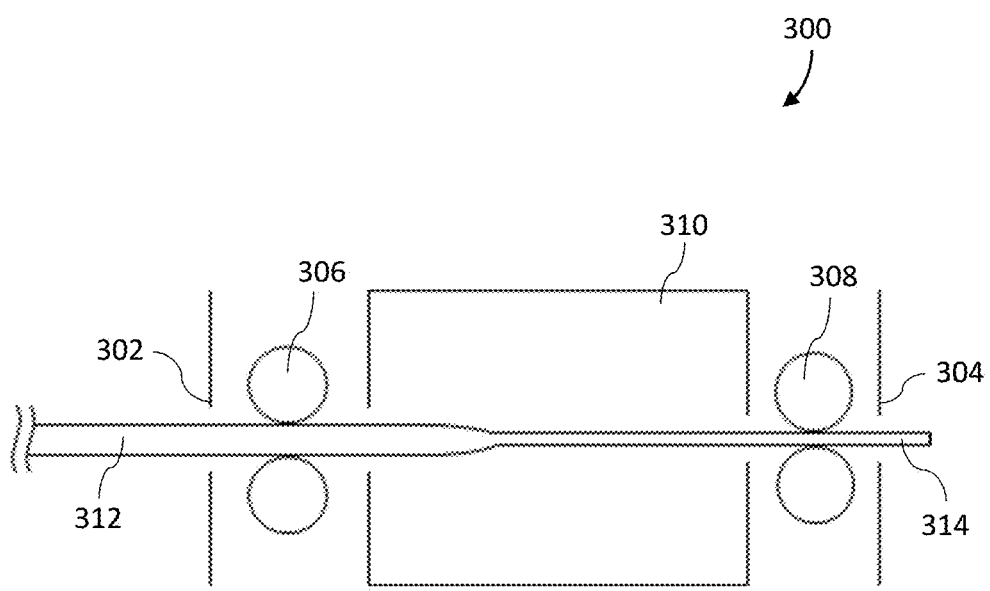
FIG. 3 shows a glass drawing system used for drawing glass capillaries, according to some aspects.

FIG. 3 shows a glass drawing system 300 used for drawing capillaries (e.g., for step S102 (FIG. 1)), according to some aspects. In some aspects, glass drawing system 300 comprises an inlet 302, an outlet 304, inlet rollers 306, outlet rollers 308, and a heating system 310. Rollers 306 and 308 can have adjustable openings to allow for different sizes of a glass blank 312 and a resulting capillary 314, as well as changes in size of the glass material as needed throughout the process.

In some aspects, a hollow glass blank 312 is inserted at inlet 302. Glass blank 312 is moved through drawing system 300 using rollers 306 and/or 308. Heating system 310 is set to a working temperature specific to the type of material of glass blank 312 (e.g., a softening point of a glass with low softening temperature). As glass blank 312 is drawn through heating system 310, rollers 306 and 308 can be set to roll at given speeds so as to draw out glass blank 312 to produce capillary 314. The final dimension of capillary 314 can be determined by the relationship of preform inlet speed to capillary outlet speed and the working temperature of heating system 310. The dimensions at the outlet can be controlled using a feedback loop system with a high precision optical measuring device to monitor the structure of capillary 314.

Figure 4:
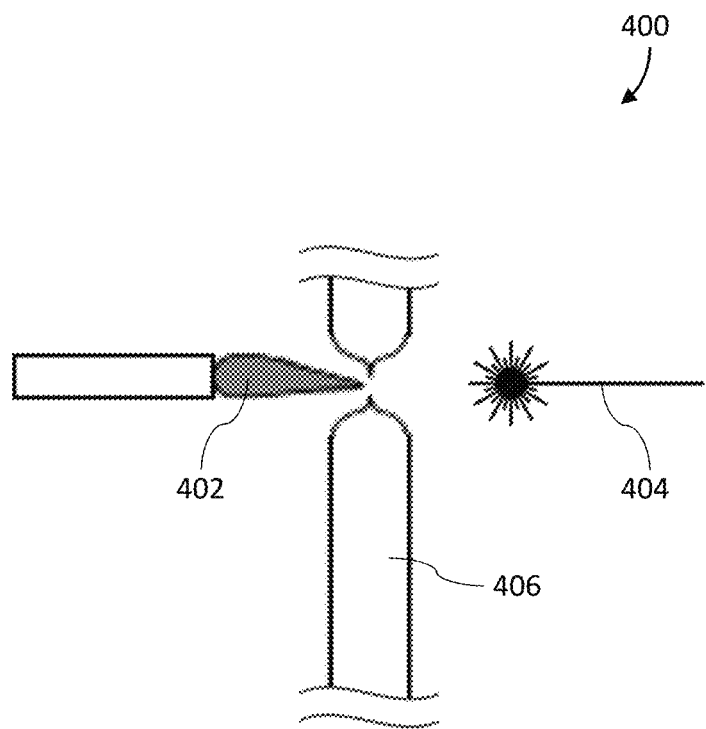
FIG. 4 shows a sealing system used for sealing and/or dividing capillaries into cells, according to some aspects.

FIG. 4 shows a sealing system 400 used for sealing and/or dividing capillaries (e.g., for steps S106, S116, and/or S118 (FIG. 1)), according to some aspects. In some aspects, sealing system 400 can comprise a source of flame 402 and/or laser 404. Sealing system 400 can also comprise a support structure (not shown) for securing and stabilizing a capillary 406. Selection of flame 402 and/or laser 404 can be based on parameters used in method 100 (FIG. 1). For example, a negative pressure differential can cause capillary 406 to collapse when using flame 402. In another example, flame 402 can require some oxygen presence, whereas laser 404 can be used with the exterior of capillary 406 at vacuum pressures so as to reduce the pressure differential to prevent collapse of capillary 406. The sealing/dividing can be executed manually (e.g., for flexibility) or automated (e.g., if high volumes of capillaries are being processed). The sealing can be performed such that the glass material of capillary 406 fuses at the portion that receives the thermal energy, resulting in a seamless, hermetic seal.

Figure 5:
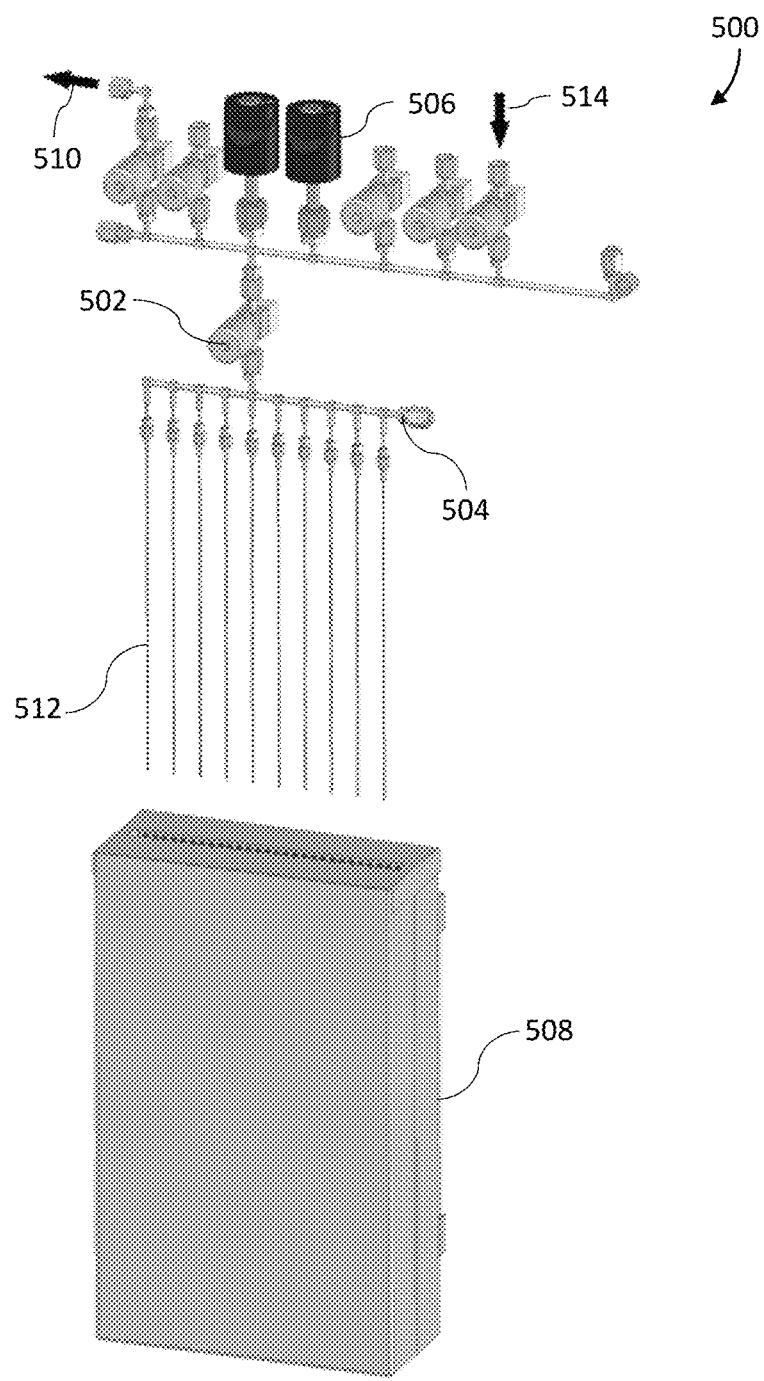
FIG. 5 shows a fluid filling system used for conditioning, purifying and/or filling capillaries, according to some aspects.

FIG. 5 shows a fluid filling system 500 used for conditioning, purifying and/or filling capillaries (e.g., for steps S104, S108, S110, S112 and/or S114 (FIG. 1)), according to some aspects. In some aspects, fluid filling system 500 can comprise a vacuum system and fluid conduits (not shown), one or more valves 502, one or more manifolds 504, one or more pressure gauges 506, and a heating system 508. The cross section of the conduits can be sufficiently large to allow for specified vacuum suction rates and to achieve target vacuum pressure.

In some aspects, one of manifolds 504 can be used to connect one or more capillaries 512 (e.g., two or more) to a common pressure junction (e.g., connected to valve 502, which connects to the vacuum system that evacuates air and all other gases along flow direction 510). Pressure gauge 506 can monitor the pressure at the pressure junction. Fluid filling system 500 can perform pretreatment of one or more capillaries 512. For example, system 500 can insert one or more capillaries 512 into heating system 508. Heating system 508 can be used to bake and/or dry one or more capillaries in conjunction with wet and/or dry cleaning processes. For example, heating system 508 can be set to approximately 150° C. or greater for $H_2O$ desorption (degassing). The temperature can be less than a softening temperature of one or more capillaries 512. The evacuating of impurities in step S108 can also be performed at elevated temperatures. The vacuum system can evacuate one or more capillaries 512 to pressures of approximately $10^{-3}$ to $10^{-6}$ mbar. The vacuum system can be a dry vacuum system (e.g., turbo molecular pump) to prevent contamination of one or more capillaries 512. Automation can be achieved by leveraging one or more vacuum gauges 506 to work in a feedback loop with one or more valves 502 (e.g., gas inlets) of the vacuum system. Pretreatment can also include physical or chemical pretreatment to condition the inner surfaces of one or more capillaries 512.

In some aspects, purification of one or more capillaries 512 can be performed by diluting and purging the environment in one or more capillaries 512 using a target fluid (i.e., the final fluid mixture to be enclosed permanently in the final glass cell product). The target fluid can be a dipolar gas (e.g., OCS, $H_2O$, $NH_3$, HCN, or the like; one type or a combination). One cycle of filling and purging one or more capillaries 512 (e.g., step S110 (FIG. 1)) can increase the purity of the target gas in the final product. Additional iterations of the filling and purging can further increase the purity of the target gas. Considering the challenge of evacuating long, thin capillaries, a final purity of approximately 90% or greater can be considered satisfactory. Higher purity can be achieved with additional purification cycles, for example, approximately 90% or greater, 92% or greater 95% or greater, 99% or greater, or the like.

In some aspects, one or more capillaries 512 can be filled for a final time to a pressure set point. The filling can take a different path from the vacuum system (e.g., along direction 514). The pressure set point can be a negative pressure, for example, approximately 0.001 to 100 mbar. The target pressure can be chosen to optimize performance in the desired application. For example, the pressure set point can be set to 0.5 mbar to maximize peak absorption intensity and minimize fullwidth at half-maximum (FWHM) for optimum performance of a time reference device. Automation can be achieved by leveraging one or more vacuum gauges 506 to work in a feedback loop with the vacuum system. Pressure sensors can be disposed proximal to the open end of one or more capillaries 512 for accurate monitoring. An additional high sensitivity vacuum gauge can be used (can be gas-dependent) to estimate the final pressure, leak rates, cleanliness, calibrate other sensors, or the like. If the additional gas-dependent vacuum gauge is used, then other vacuum gauges can be gas-independent.

In some aspects, it is desirable for the open end of the glass capillaries to be vacuum-tight for the connection to the vacuum system. The vacuum seal can be achieved using rubber seals, thermal induced direct metal-to-glass seal, glass solder or gluing a vacuum fitting to one or more capillaries 512 using vacuum adhesive.

Example Use Case of Hermetic Glass Cell

Figure 6:
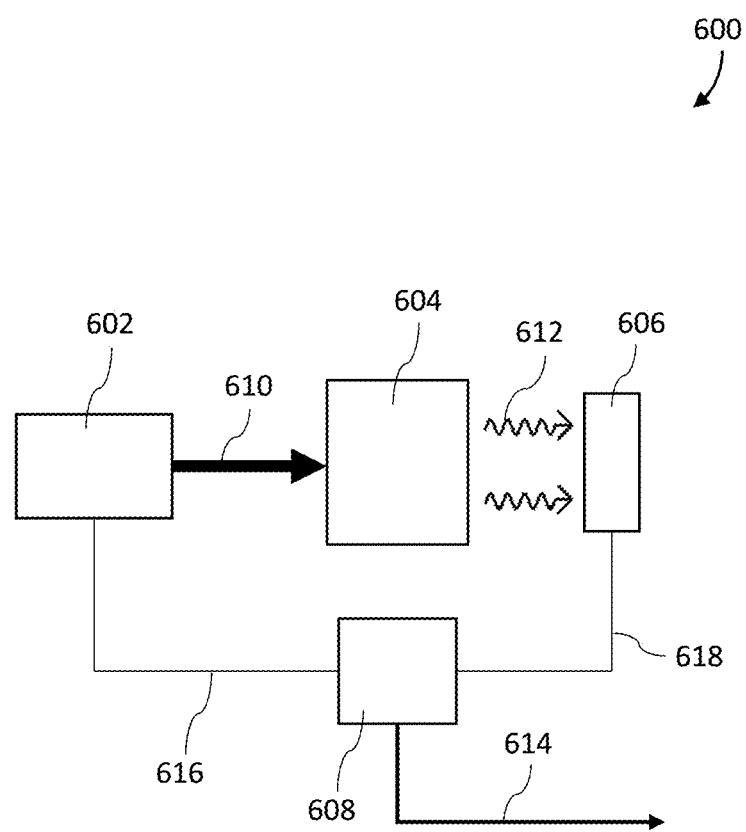
FIG. 6 shows a time reference device, according to some aspects.

FIG. 6 shows a time reference device 600, according to some aspects. In some aspects, time reference device 600 can comprise a radiation source 602, one or more hermetic glass cells 604, a detector 606, and a controller 608. One or more hermetic glass cells can be fabricated according to some aspects described above. For example, a pressure of a dipolar gas in the hermetic glass cell can be approximately 0.001 to 100 mbar, a purity of the dipolar gas can be approximately 90% or greater, and the structures can be seamless enclosures.

Other features of one or more hermetic glass cells are envisaged according to aspects described herein. For example, in some aspects, the gas contained in the cells can be stable for periods much longer than other containers that rely on capping the opening of the containers (e.g., MEMS). Seams of capped structures can allow atmospheric air to leak and contaminate the dipolar gas, rendering the device unusable for its intended purpose. Based on the fabrication method steps disclosed herein, one or more glass cells 604 can stably contain and keep pure a gas for approximately 5 to 10 years or more.

In some aspects, radiation source can generate radiation 610 to irradiate the dipolar gas in one or more hermetic glass cells 604. The gas can be a dipolar gas (e.g., OCS, $H_2O$, $NH_3$, HCN, or the like). The irradiated dipolar gas can absorb radiation 612 according to vibrational and or rotational quantum transitions of the dipolar gas. Radiation 612 can comprise characteristics of a vibrational and or rotational spectrum of the dipolar gas. Radiation 612 can be received at detector 606. Detector 606 can generate a measurement signal that corresponds to the received radiation 612, and thus the measurement signal can comprise information about the characteristics of the vibrational and or rotational spectrum of the dipolar gas.

In some aspects, the glass material of one or more hermetic glass cells 604 can have a low dielectric loss factor, tan ($\delta$). The loss factor can be, for example, approximately $100 \cdot 10^{-4}$ or less, $200 \cdot 10^{-4}$ or less, between 100 to $200 \cdot 10^{-4}$, or the like, for a given operating frequency or frequency range(s). The operating frequency can be, for example, sub-terahertz frequency (e.g., approximately 1 to 1000 GHz). The operating frequency can vary depending on the type of gas present in one or more hermetic glass cells 604.

In some aspects, time reference device 600 can provide a time reference 614 based on the vibration or rotational spectrum of the dipolar gas. For example, controller 608 can be in communication with radiation source 602 via communication path 616. Controller 608 can receive the measurement signal from detector 606 via communication path 618. Controller 608 can analyze the measurement signal. Controller 608 can provide time reference 614 based on the analysis of the vibration or rotational spectrum of the dipolar gas. And since one or more hermetic glass cells 604 can be fabricated at small sizes, the glass cells are convenient for on-chip atomic clock applications.

In some aspects, time reference device 600 can be an on-chip molecular clock. One example of a MEMS-based on-chip clock is disclosed by Cheng et al., "An on-chip fully electronic molecular clock based on sub-terahertz rotational spectroscopy", Nature Electronics 1.7 (2018), which is incorporated by reference herein in its entirety. Time reference device 600 can be a non-MEMS alternative of the clock disclosed by Cheng.

It is to be appreciated that hermetic glass cells disclosed herein are not limited to time reference device applications. The glass cells can be used in other applications where long term storage of fluids is desirable (e.g., medical, tactical, or the like).

The method steps described herein (e.g., FIG. 1) can be performed in any conceivable order and it is not required that all steps be performed. Moreover, the operations and functions described herein merely reflect an example of method steps and are not limiting. That is, additional method steps are envisaged based on functions described in reference to FIGS. 2-6.

It is to be understood that the phraseology or terminology herein is for the purpose of description and not of limitation, such that the terminology or phraseology of the present specification is to be interpreted by those skilled in relevant art(s) in light of the teachings herein.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed. The foregoing description of specific aspects will so fully reveal the general nature of the present disclosure that others can, by applying knowledge within the skill of the art, readily modify and/or adapt for various applications such specific aspects, without undue experimentation and without departing from the general concept of the present disclosure. Therefore, such adaptations and modifications are intended to be within the meaning and range of equivalents of the disclosed aspects, based on the teaching and guidance presented herein.

It is to be understood that the Detailed Description section, and not the Summary and Abstract sections, is intended to be used to interpret the claims. The Summary and Abstract sections can set forth one or more, but not necessarily all, aspects of the present disclosure as contemplated by the inventor(s), and thus, are not intended to limit the present disclosure and the appended claims in any way. The breadth and scope of the protected subject matter should not be limited by any of the above-described aspects, but should be defined in accordance with the following claims and their equivalents.

What is claimed is:

1. A method of fabricating one or more glass cells for enclosing a gas, the method comprising:
    drawing one or more glass capillaries from a source of glass material comprising aluminosilicate, the drawing comprising:
        setting a cross section of the one or more glass capillaries to a height of approximately 0.15 to 5 mm and a width of approximately 0.3 to 10 mm; and
        drawing the one or more glass capillaries to a length of approximately 5 to 1500 mm;
    performing a first conditioning of one or more inner surfaces of the one or more glass capillaries, the first conditioning comprising a wet process, a dry process, or wet and dry cleaning processes;
    sealing one or more first ends of the one or more glass capillaries by applying thermal energy to the one or more first ends;
    performing a second conditioning of the one or more inner surfaces after the sealing, the second conditioning comprising:
        a wet process, a dry process, or wet and dry cleaning processes;
        heating the one or more glass capillaries to accelerate degassing of the one or more inner surfaces; and
        evacuating impurities from the one or more glass capillaries using a vacuum system;
    purifying the one or more glass capillaries to increase a purity of a gas used to fill the one or more glass capillaries, the purifying comprising:
        filling the one or more glass capillaries using one or more gases; and
        evacuating the one or more glass capillaries after the filling;
    filling the one or more glass capillaries using the gas after the purifying;
    pressurizing the one or more glass capillaries to a given pressure;
    sealing one or more second ends of the one or more glass capillaries using thermal energy; and
    dividing each of the one or more glass capillaries using thermal energy to produce the one or more glass cells that are seamless and hermetically sealed, wherein a dielectric loss factor of the one or more glass cells is approximately $200 \cdot 10^{-4}$ or less for a sub-terahertz frequency.

2. The method of claim 1, wherein the gas is a dipolar gas.

3. The method of claim 2, wherein the dipolar gas comprises carbonyl sulfide (OCS).

4. The method of claim 1, wherein the drawing of the one or more glass capillaries from the source of glass material further comprises setting a wall thickness of the one or more glass capillaries to approximately 50 microns to 1 mm.

5. The method of claim 1, wherein the given pressure is approximately 0.001 to 100 mbar.

6. The method of claim 1, wherein the purifying further comprises purifying the gas to a purity of approximately 90% or greater.

* * * * *